United States Patent
Ono et al.

(10) Patent No.: US 10,839,733 B2
(45) Date of Patent: Nov. 17, 2020

(54) DISPLAY HAVING GATE LINES WITH ZIGZAG EXTENSIONS

(71) Applicant: Apple Inc., Cupertino, CA (US)

(72) Inventors: Shinya Ono, Cupertino, CA (US); Chun-Yao Huang, Cupertino, CA (US); Hao-Lin Chiu, Campbell, CA (US); Ivan Knez, San Jose, CA (US); Patrick B. Bennett, Alameda, CA (US); Shih Chang Chang, Cupertino, CA (US); Byung Duk Yang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 310 days.

(21) Appl. No.: 15/162,974

(22) Filed: May 24, 2016

(65) Prior Publication Data

US 2017/0084214 A1 Mar. 23, 2017

Related U.S. Application Data

(60) Provisional application No. 62/221,535, filed on Sep. 21, 2015.

(51) Int. Cl.
*G09G 3/20* (2006.01)
*G02F 1/1362* (2006.01)
*G02F 1/1345* (2006.01)
*H01L 27/12* (2006.01)

(52) U.S. Cl.
CPC ......... *G09G 3/20* (2013.01); *G02F 1/136286* (2013.01); *G02F 2001/13456* (2013.01); *G09G 2300/043* (2013.01); *G09G 2300/0413* (2013.01); *G09G 2300/0426* (2013.01); *G09G 2300/08* (2013.01); *G09G 2310/0278* (2013.01); *G09G 2310/0281* (2013.01); *G09G 2320/0209* (2013.01); *G09G 2320/0219* (2013.01); *H01L 27/124* (2013.01)

(58) Field of Classification Search
None
See application file for complete search history.

(56) References Cited

U.S. PATENT DOCUMENTS

| | | |
|---|---|---|
| 7,508,479 B2 | 3/2009 | Kim et al. |
| 7,548,288 B2 | 6/2009 | Kim et al. |
| 7,965,285 B2 | 6/2011 | Kwak et al. |
| 8,345,204 B2 | 1/2013 | Lee et al. |
| 8,804,080 B2 | 8/2014 | Jang et al. |

(Continued)

*Primary Examiner* — Andre L Matthews
(74) *Attorney, Agent, or Firm* — Treyz Law Group, P.C.; G. Victor Treyz; David K. Cole

(57) ABSTRACT

A display may have an array of pixels arranged in rows and columns. Display driver circuitry may be provided along an edge of the display. Data lines that are associated with columns of the pixels may be used to distribute data from the display driver circuitry to the pixels. Gate lines in the display may each have a horizontal straight portion that extends along a respective row of the pixels and may each have one or more non-horizontal segments such as zigzag segments. The non-horizontal portion of each gate line may be connected to the horizontal straight portion of the gate line by a via. The non-horizontal portions may each have portions that are overlapped by portions of the data lines. Dummy gate line structures may be provided on the display that are not coupled to any of the pixels in the display.

17 Claims, 14 Drawing Sheets

(56) References Cited

U.S. PATENT DOCUMENTS

| | | | |
|---|---|---|---|
| 8,866,707 B2* | 10/2014 | Koyama | G09G 3/3258 345/82 |
| 2008/0018583 A1* | 1/2008 | Knapp | G02F 1/1333 345/99 |
| 2009/0102824 A1 | 4/2009 | Tanaka et al. | |
| 2013/0113766 A1 | 5/2013 | Kim et al. | |
| 2013/0222218 A1 | 8/2013 | Song | |
| 2014/0043306 A1* | 2/2014 | Min | G09G 3/3685 345/204 |
| 2014/0071361 A1* | 3/2014 | LV | G02F 1/13306 349/33 |
| 2015/0138473 A1 | 5/2015 | Zhang | |
| 2015/0340001 A1* | 11/2015 | Jung | G02F 1/136286 345/205 |
| 2016/0005351 A1* | 1/2016 | Jeon | G09G 3/20 345/204 |
| 2017/0053597 A1* | 2/2017 | Kim | G09G 3/3266 |

* cited by examiner ized, a display is shown in FIG. 1. As shown in
DISPLAY HAVING GATE LINES WITH ZIGZAG EXTENSIONS This application claims the benefit of provisional patent application No. 62/221,535, filed Sep. 21, 2015, which is hereby incorporated by reference herein in its entirety.

BACKGROUND

This relates generally to electronic devices, and more particularly, to electronic devices with displays.

Electronic devices often include displays. For example, cellular telephones and portable computers often include displays for presenting information to a user.

Displays contain arrays of pixels for presenting images to users. Date lines that extend vertically through the display are associated with columns of the pixels. Control lines called gate lines that extend horizontally through the display are associated with rows of the pixels. The gate lines are used in controlling the loading of the data from the data lines into the pixels. Gate line driver circuitry along the left and right edges of the display is used in supplying gate line signals to the gate lines.

For aesthetic reasons and to save space in an electronic device, it may be desirable to reduce the size of the borders of a display and to create displays that are otherwise not constrained by the locations of display driver circuitry. The presence of driver circuitry along the edges of the display limits the minimum achievable border size for a display and restricts display layout. If care is not taken, a display will have larger inactive borders than desired.

It would therefore be desirable to be able to provide improved displays for electronic devices such as displays with minimized borders.

SUMMARY

A display may have an array of pixels arranged in rows and columns. Display driver circuitry may be provided along an edge of the display. Data lines that are associated with columns of the pixels may be used to distribute data from the display driver circuitry to the pixels. Gate lines in the display may be used to distribute control signals to the pixels from the display driver circuitry.

Each gate line may have a horizontal straight portion that extends along a respective row of the pixels and a vertical portion or other non-horizontal portion that connects the horizontal portion to gate driver circuitry in the display driver circuitry. Each vertical portion or other non-horizontal portion of a gate line may have one or more non-straight segments such as one or more zigzag segments or diagonal portions that cross multiple data lines. The non-horizontal segments of each gate line may be connected to the horizontal straight portion of the gate line by respective vias. The non-horizontal portions may each have portions that are overlapped by portions of the data lines or may extend diagonally with respect to the data lines with an orientation that is at a non-zero angle and non-perpendicular angle with respect to the horizontal portions. The use of non-straight shapes and/or diagonal shapes for the non-horizontal portions may help spread total capacitive coupling across many overlapping data lines, reducing coupling to any individual data line. Dummy gate line structures may be provided on the display that are not connected to any of the pixels in the display.

With this arrangement, it is not necessary to locate display driver circuitry along multiple edges of the display, which allows the display to be formed in an arbitrary shape (i.e., a free-form display shape such as a non-rectangular shape with one or more edges and all of the driving circuitry located along a single one of the edges, a circular shape, an oval shape, a shape with straight edges, curved edges, or a combination of straight and curved edges, etc.).

DETAILED DESCRIPTION

Figure 1:
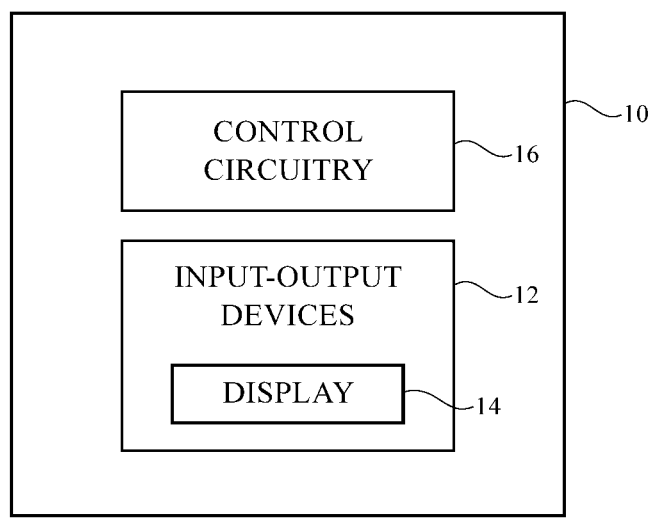
FIG. 1 is a schematic diagram of an illustrative electronic device with a display in accordance with an embodiment.

An illustrative electronic device of the type that may be provided with a display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14.

Display 14 may be any suitable type of display. As an example, display 14 may be a liquid crystal display that includes an array of backlit liquid crystal display pixels, may be a light-emitting diode display that includes an array of light-emitting devices such as light-emitting diodes (e.g., organic light-emitting diodes, quantum dot light-emitting diodes, light-emitting diodes formed from discrete crystalline semiconductor dies, etc.), or may be any other type of display (e.g., an electrowetting display, an electrophoretic display, a plasma display, etc.).

Figure 2:
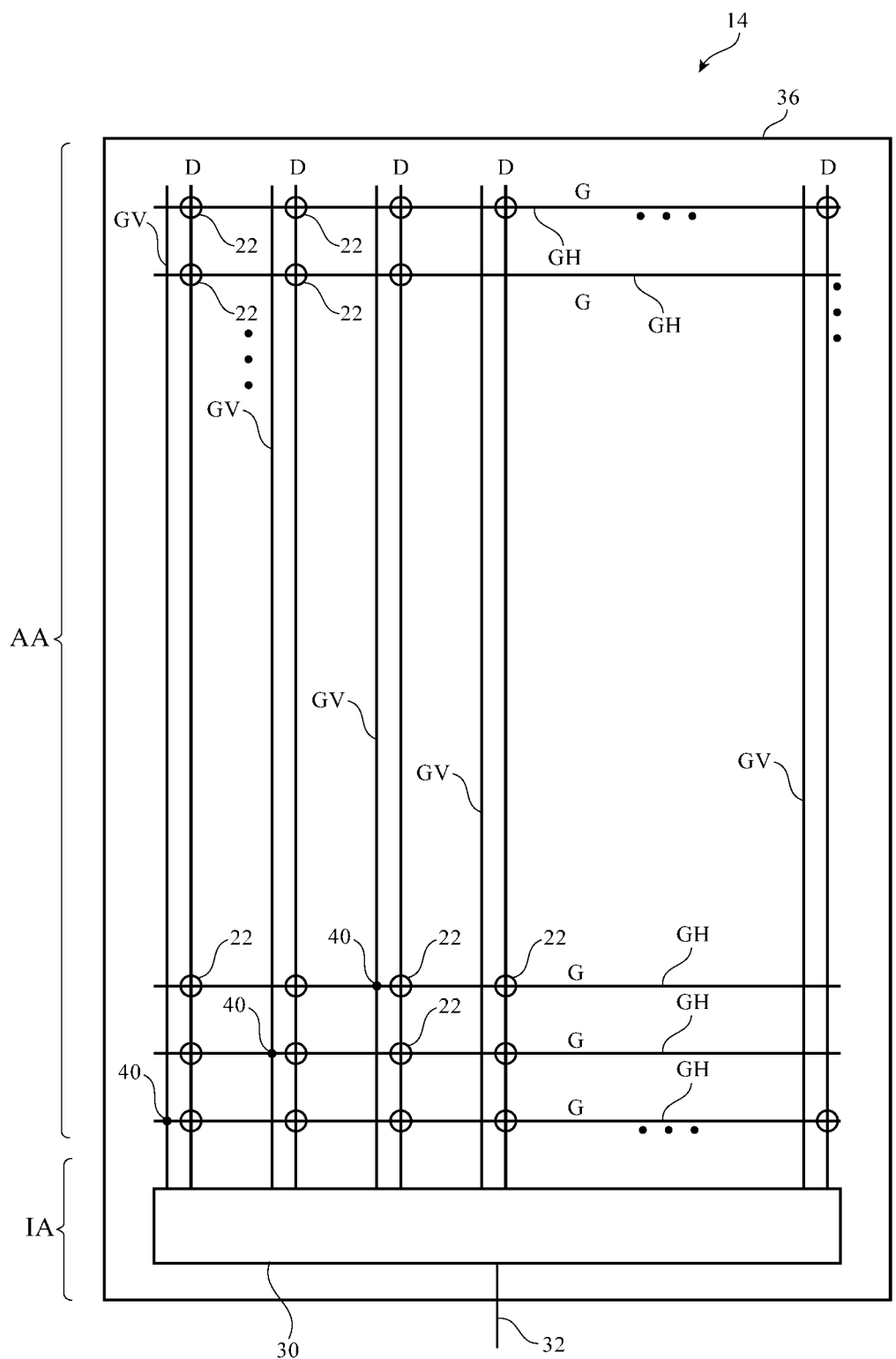
FIG. 2 is a diagram of an illustrative display in accordance with an embodiment.

FIG. 2 is a diagram of an illustrative display for device 10. As shown in FIG. 2, display 14 may have an array of pixels 22 for displaying images for a user. Pixels 22 may be formed from one or more display layers such as substrate layer 36. Substrate 36 may be rectangular and may have four edges, may be oval, may be circular, may have both straight and curved edges, or may have other suitable shapes. The array of pixels 22 may be arranged to form rows and columns. There may be any suitable number of rows and columns in the array of pixels 22 (e.g., ten or more, one hundred or more, or one thousand or more). Pixels 22 may each contain subpixels of different colors. As an example, each pixel 22 may have a red subpixel that emits red light, a green subpixel that emits green light, and a blue subpixel that emits blue light. Configurations for display 14 that include subpixels of other colors may be used, if desired.

Display driver circuitry 30, which may be located along one of the edges of display 14, may be used to control the operation of pixels 22. Display driver circuitry 30 may be formed from integrated circuits, thin-film transistor circuits, or other suitable circuitry. Display driver circuitry 30 of FIG. 2 may contain communications circuitry for communicating with system control circuitry such as control circuitry 16 of FIG. 1 over path 32. Path 32 may be formed from traces on a flexible printed circuit or other cable. During operation, the control circuitry (e.g., control circuitry 16 of FIG. 1) may supply circuitry 30 with information on images to be displayed on display 14.

To display the images on display pixels 22, display driver circuitry 30 may supply image data to data lines D while providing control signals on control lines such as gate lines G. The control signals on gate lines G may include scan line signals and emission enable control signals (e.g., in light-emitting diode displays), gate line signals for controlling rows of pixels in liquid crystal displays, and/or other control signals (gate line signals) for controlling the pixels of each row. There may be any suitable number of gate lines G per row of pixels 22 (e.g., one or more, two or more, three or more, four or more, etc.). Configurations in which there is a single gate line G per row of pixels 22 may sometimes be described herein as an example. There may be more columns of pixels 22 than rows of pixels 22 in display 14 or other configurations for the pixels of display 14 may be used in device 10.

With the illustrative layout of FIG. 2, data lines D run vertically and are each associated with a respective column of pixels 22. Gate lines G each include a non-horizontal (e.g., vertical) gate line portion (segment) GV and a horizontal gate line portion (GH). Each horizontal gate line segment GH extends horizontally across display 14 and is associated with a respective row of pixels 22 (e.g., each gate line segment GH may be used to control the gates of transistors in a given row of pixels 22). Non-horizontal gate line portions GV may extend vertically, diagonally, and/or horizontally through display 14. Gate line portions GV may be used to route gate line signals (sometimes referred to as gate signals or pixel control signals) from display driver circuitry 30 to respective horizontal gate line segments GH. Each gate line portion GV is connected to a respective gate line portion GH at a respective gate line segment connection 40. Connections 40 may be formed using vias or other suitable conductive coupling structures.

Display 14 may have an active area AA that contains an array of pixels 22 to display images for a user. Display 14 may have an inactive border region such as inactive area IA that does not contain any pixels 22 for displaying images. Inactive area IA may contain circuitry such as display driver circuitry 30. It is not necessary to provide inactive border areas IA along the left edge or right edge of active area AA to accommodate gate driver circuitry or other display driver circuitry, because gate line signals may be routed from display driver circuitry 30 along the lower edge of display 14 to horizontal gate line portions GH using gate line portions GV. This helps minimize or eliminate undesired display border regions.

Figure 3:
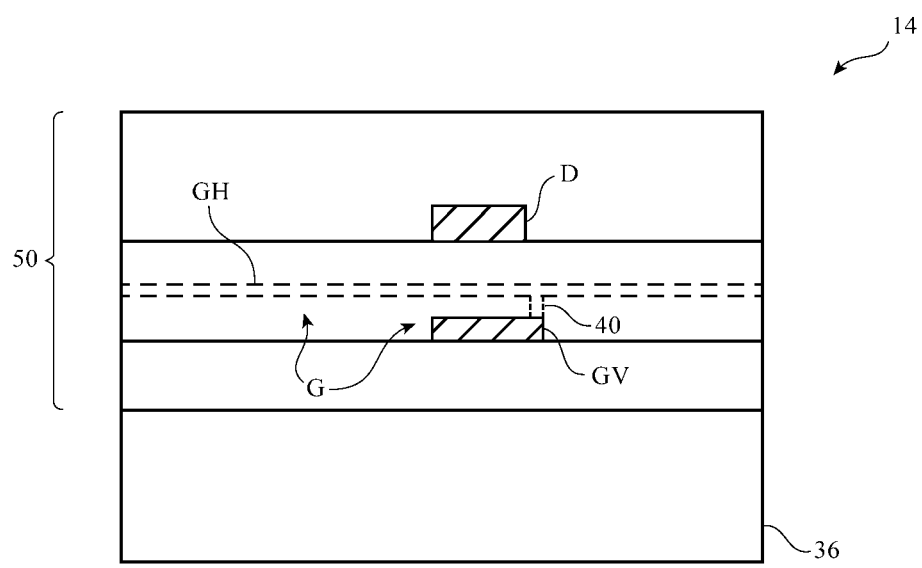
FIG. 3 is a cross-sectional side view of an illustrative display showing how portions of gate lines may be overlapped by data lines in accordance with an embodiment.

A cross-sectional side view of a portion of display 14 of FIG. 2 is shown in FIG. 3. As shown in FIG. 3, display 14 may include thin-film circuitry formed from layers 50 of material on substrate 36. Layers 50 may include blanket films and patterned layers (e.g., dielectric, metal layers patterned to form signal lines, semiconductor layers patterned to form channel regions in transistors, etc.). For example, layers 50 may include metal lines that are patterned to form data lines D and gate lines G. Gate lines G may include horizontal portions GH that extend perpendicularly to vertically extending data lines D. Gate lines G may also include portions GV that are connected to respective portions GH by respective vias such as via 40. Portions GV may include at least some segments that extend parallel to data lines D, as shown in FIG. 3. To enhance the aperture ratio of pixels 22 (i.e., the amount of light emitting area relative to non-light-emitting area), it may be desirable to form gate line portions GV under data lines D. As shown in FIG. 3, for example, both data line D and gate line portion GV may extend parallel to each other into the page (i.e., so that data line D overlaps and runs above gate line portion GV).

Figure 4:
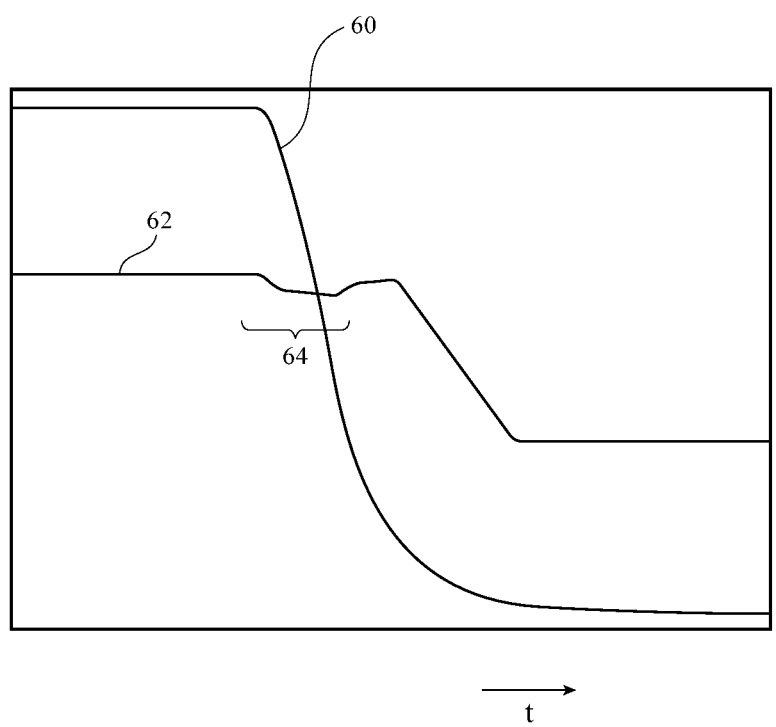
FIG. 4 is a diagram showing how there is a potential for data line voltages to be disturbed by signal transitions on capacitively coupled gate lines.

There is a risk of capacitive coupling between a given gate line G and a given data lines D if there is too much overlap between the gate line portion GV of the given gate line and the given data line D. The impact of capacitive coupling between gate lines G and data lines D is shown in the example of FIG. 4. In the example of FIG. 4, curve 62 corresponds to a data line signal on a given one of data lines D. Curve 60 corresponds to an illustrative gate line signal. As shown in FIG. 4, there is a risk of signal disruption (signal variations 64) in data line signal 62 due to the transition of gate line signal 60 due to capacitive coupling between the gate and data lines. This signal disruption can adversely affect display performance (e.g., the accuracy of the data signals loaded into pixels 22 can be adversely affected).

Figure 5:
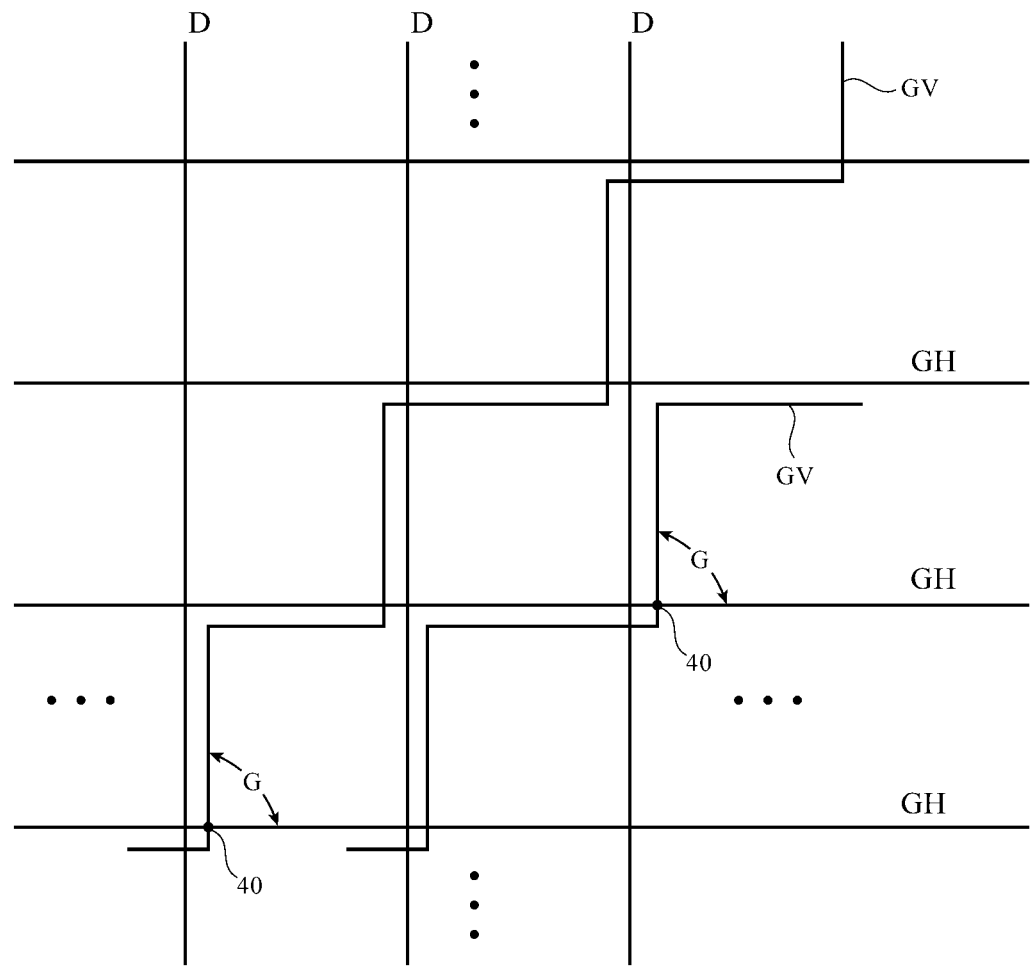
FIG. 5 is a diagram showing how gate lines may have zigzag portions to minimize data line coupling in accordance with an embodiment.

To avoid excessive capacitive coupling between gate lines G and data lines D, gate line portions GV may be provided with shapes that are not straight lines (i.e., non-straight shapes). In this way, each gate line is only overlapped by a given data line for a fraction of the length of the given data line, thereby minimizing capacitive coupling. An illustrative configuration for reducing capacitive coupling in this way is shown in FIG. 5. As shown in the example of FIG. 5, gate line portions GV of gate lines G may be provided with zigzag shapes (i.e., non-straight shapes that minimize overlap between each gate line G and any given data line D). There may be one or more zigzag portions GV connected to each straight gate line portion GH with a respective via.

Figures 6, 7:
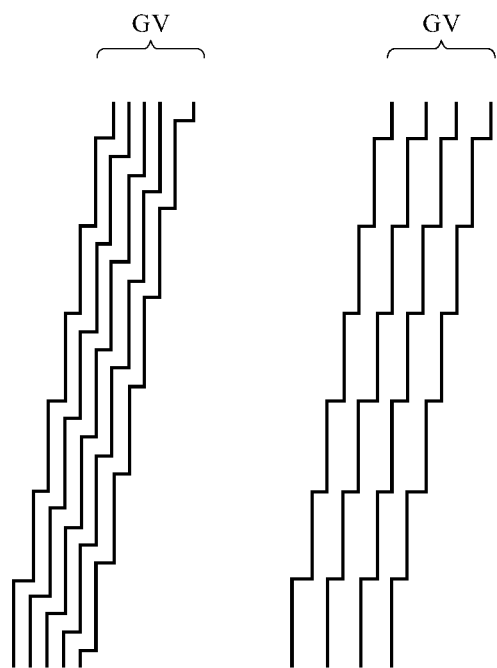
FIGS. 6 and 7 are diagrams of illustrative gate line zigzag patterns for a display in accordance with an embodiment.

In general, any suitable non-straight zigzagging shape may be used for gate line portions GV. An illustrative waterfall pattern that may be used for non-horizontal gate line portions GV is shown in FIG. 6. An illustrative staircase pattern that may be used for non-horizontal gate line portions GV is shown in FIG. 7. Other zigzag patterns and/or combinations of these patterns may be used, if desired. The configurations of FIGS. 6 and 7 are merely examples.

Figure 8:
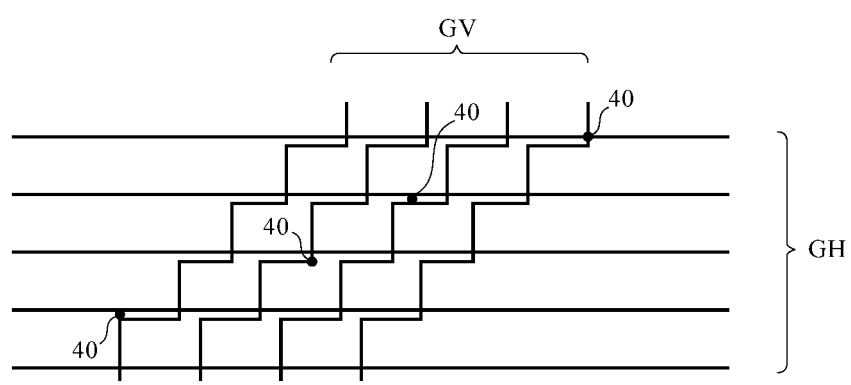
FIGS. 8 and 9 are diagrams of zigzag portions of gate lines showing how the gate lines may be connected to horizontal gate line portions in accordance with an embodiment.
Figure 9:
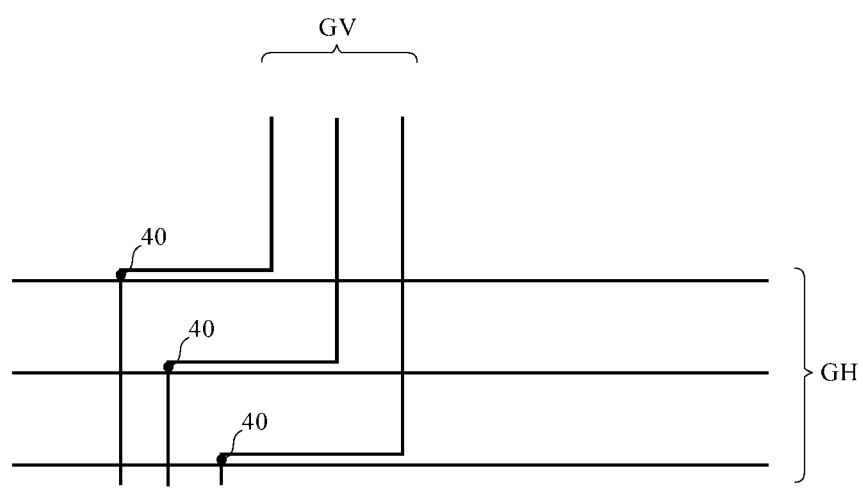

Connections 40 may be located at any positions along the lengths of portions GV or in proximity to portions GV, as shown in the illustrative connection layout diagrams of FIG. 8 (for a staircase gate line segment pattern) and FIG. 9 (for a waterfall gate line segment pattern).

Figure 10:
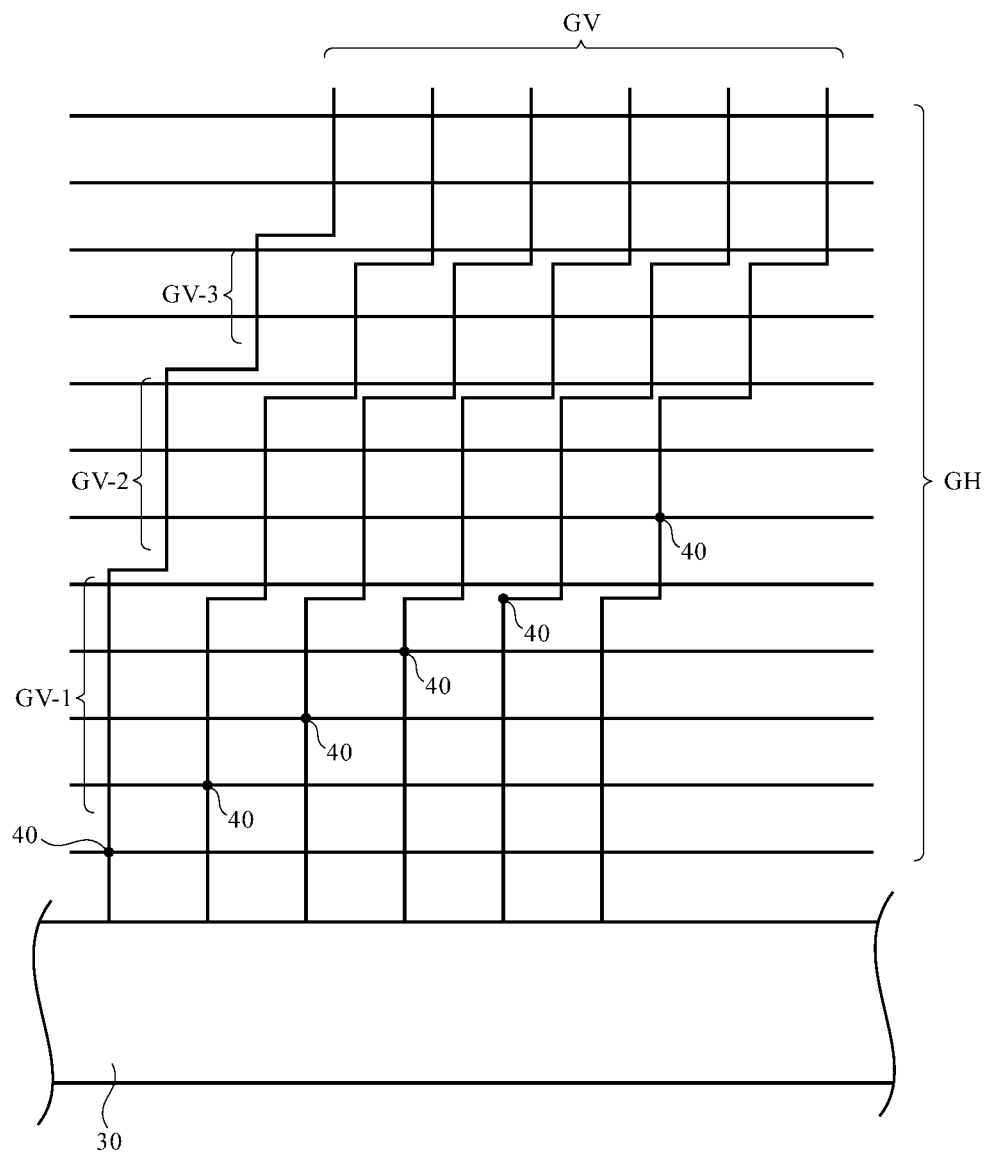
FIG. 10 is a diagram of an illustrative gate line pattern in which vertical segments of each gate line have decreasing length and therefore traverse decreasing numbers of the rows of pixels as a function of increasing distance from the display driver circuitry in accordance with an embodiment.

The potential for data line disturbances (sometimes referred to as data line kick) due to capacitive coupling from gate lines is smaller near the output of data line driver circuitry 30 than at locations that are distant from data line driver circuitry 30. As a result, gate line portions GV can tolerate larger amounts of data line overlap at locations near display driver circuitry 30 than at locations that are farther from display driver circuitry 30. An illustrative pattern that may be used for gate line portions GV that takes advantage of the larger tolerance for data line overlap with gate line portions GV at locations near display driver circuitry 30 is shown in FIG. 10. In this example, gate line portions GV include vertical segments GV-1, vertical segments GV-2, and vertical segments GV-3 coupled by respective horizontal segments. Segments GV-1 are closer than segments GV-2 to display driver circuitry 30. Segments GV-2 are closer to display driver circuitry 30 than segments GV-3. As a result, segments GV-1 may overlap respective lines D (not shown in FIG. 10) for longer distances than segments GV-2 and segments GV-2 may overlap data lines D for longer than segments GV-3. Other patterns that ensure that data line overlap (vertical gate line segment length) decreases or otherwise changes as a function of increasing distance away from display driver circuitry 30 may be used if desired. The pattern of FIG. 10 is merely illustrative.

Figure 11:
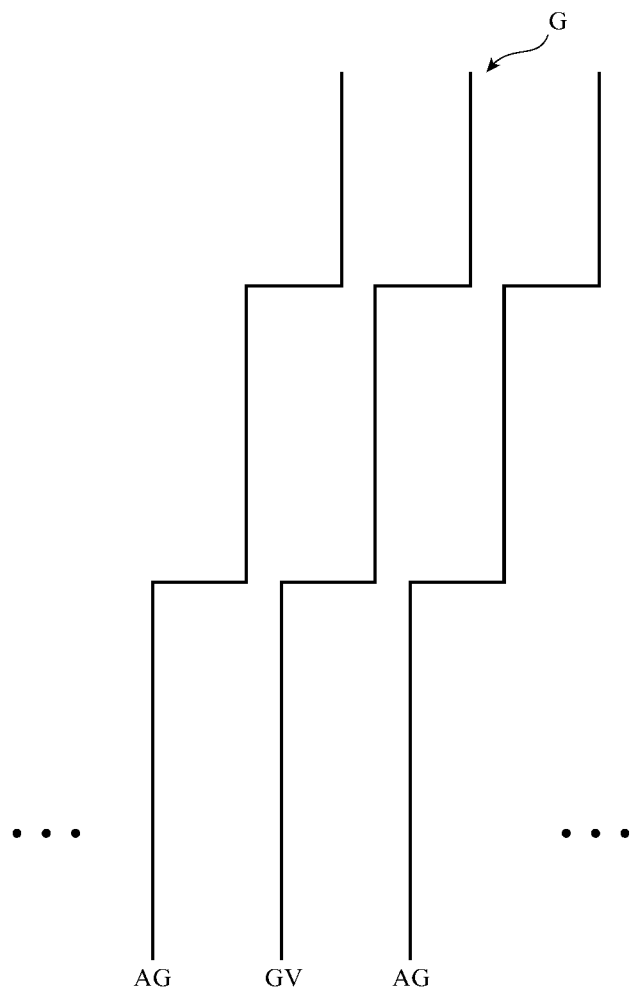
FIG. 11 is a diagram showing how an active gate line on which a gate line signal is being asserted may be flanked by adjacent auxiliary gate lines that are modulated with compensating signals of opposite swing direction (positive swing direction rather than negative swing direction or vice versa) to the gate line signal in accordance with an embodiment.
Figure 12:
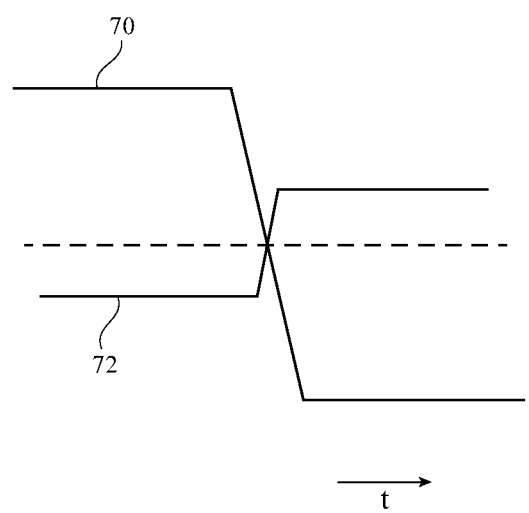
FIG. 12 is a graph showing illustrative signals that may be driven onto the active and auxiliary gate lines of FIG. 11 during operation of a display in accordance with an embodiment.

If desired, data line signal disruption may be minimized by modulating adjacent gate lines (e.g., dummy lines that serve as auxiliary signal lines) in the opposite direction from an active gate line G. FIG. 11 shows how a gate line (e.g., the portion GV of gate line G) may be flanked by adjacent auxiliary gate lines AG. Gate lines AG may be dummy gate lines that are not connected to any pixels 22 or horizontal gate line segments GH in gate lines G in display 14. The graph of FIG. 12 shows an illustrative modulation scheme that may be used for the active and auxiliary gate lines of FIG. 11. In the graph of FIG. 12, curve 70 corresponds to the signal on an active gate line such as gate line G of FIG. 11 (i.e., the signal driven onto portion GV). Curve 72 corresponds to the compensating signal of opposite swing that may be imposed on one or both of the auxiliary lines AG of FIG. 11. If, for example, curve 70 is decreasing from 5 to −5 and therefore has a negative swing (swing direction), curve 72 may be increasing from −1 to 1 or from −2 to −1 or from 1 to 2 and therefore may have an opposite positive swing). Due to the use of a zigzag pattern such as a waterfall pattern, staircase pattern, or other zigzag pattern for gate line portions GV, each gate line (including the active gate line and both of the auxiliary gate lines) will have some overlap with a given data line D. The presence of compensating signals 72 (i.e., signals with opposite swing direction) on the auxiliary gate lines will therefore tend to cause a signal disruption in the date line D that is equal and opposite to the signal disruption produced by the active gate line (see, e.g., disruption 64 of FIG. 4), thereby ensuring that disruption to the signal on data line D will be minimized.

Figure 13:
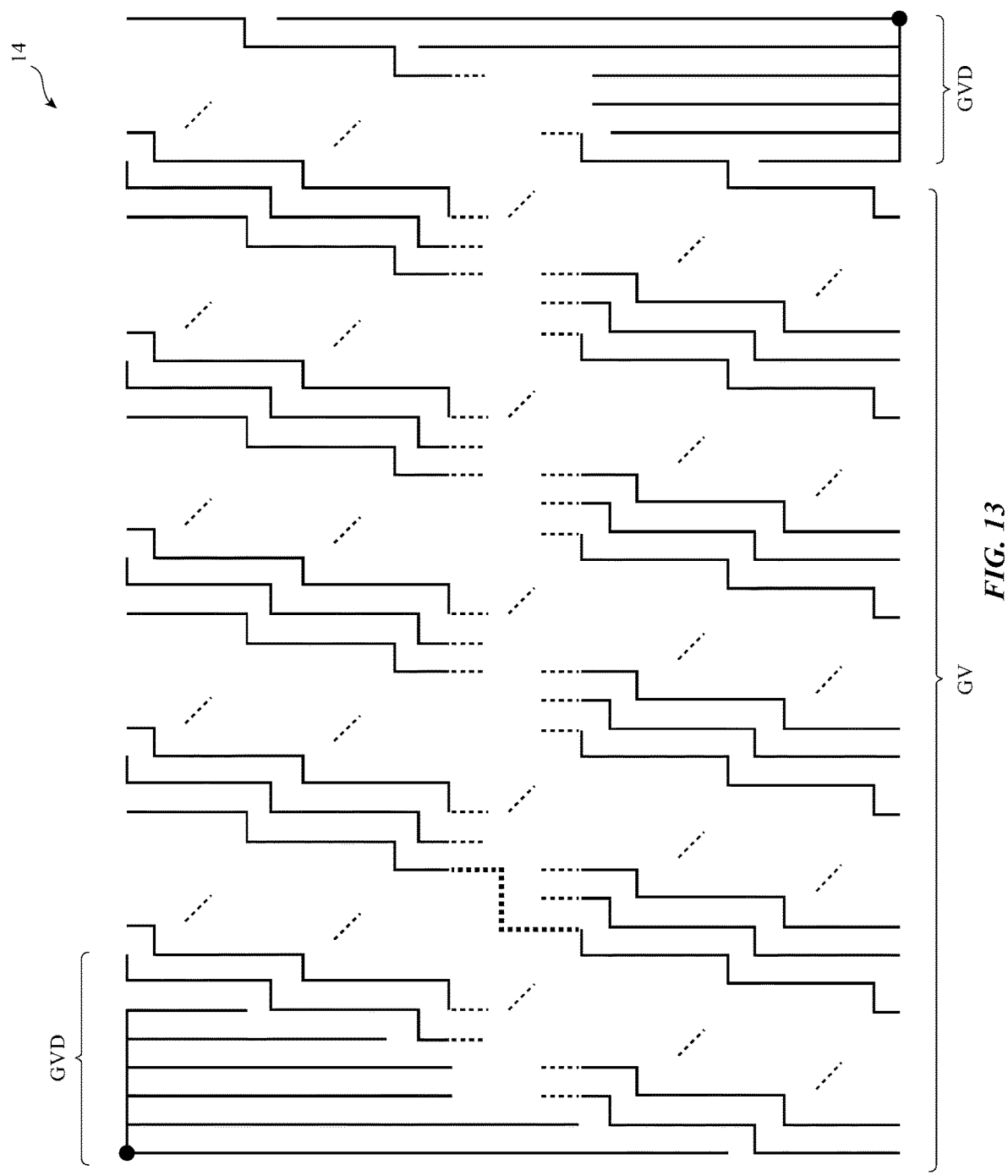
FIGS. 13 and 14 are diagrams of illustrative patterns of zigzagging gate line segments in accordance with an embodiment.

If desired, a portion of the gate line metal on display 14 may be patterned to form dummy lines that help ensure that the visual appearance of the display (e.g., display reflectivity, etc.) is uniform across the surface of the display. As shown in FIG. 13, for example, dummy sections of gate line metal such as dummy lines GVD may be used to help ensure that the appearance of display 14 does not vary significantly across the surface of display 14. Dummy lines GVD may be grounded, may not be connected to any of pixels 22 or any gate line portions GH, and may be electrically isolated from all of the gate line portions GH on display 14. Dummy lines GVD may be formed from the same patterned metal layer that is used in forming active gate line portions GV.

Figure 14:
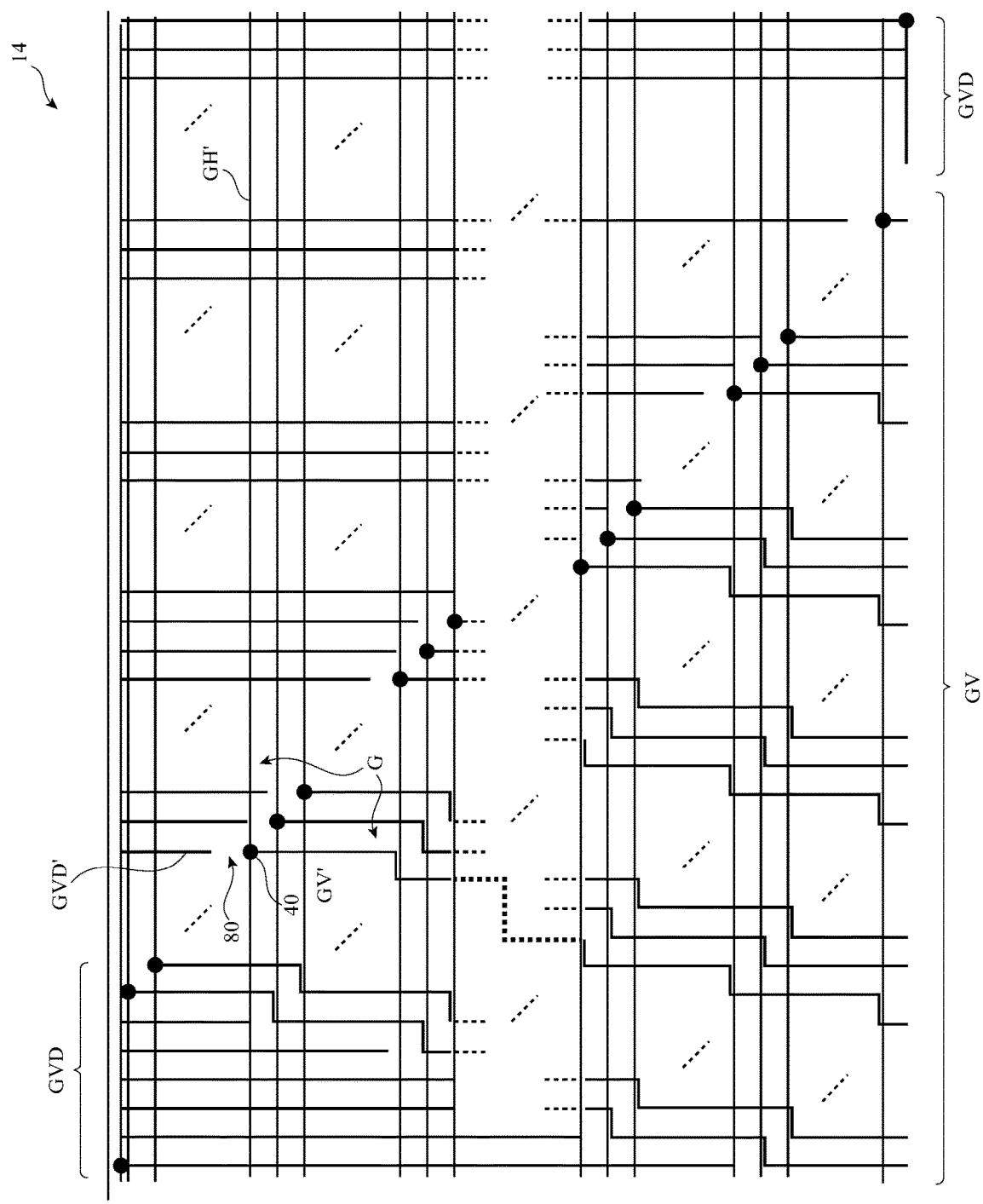

FIG. 14 shows how portions GV of gate lines G in display 14 may be divided into dummy segments and active segments. As an example, gate line G may have a horizontal portion GH' that is connected to an active vertical portion GV' at connection 40 (e.g., using a via or other coupling structure). Gap 80 may be formed in portion GV of gate line G. This divides the zigzag portion GV into active gate line portion (segment) GV' and dummy gate line segment GVD'. Portion GVD' may be connected to the other dummy lines in display 14 (i.e., dummy structures GVD) and may be grounded. By separating the unneeded gate line portion GVD' (i.e., the portion of the conductive line GV that extends past connection 40) from active gate line portion GV', capacitive loading on gate line portion GV' and therefore capacitive loading on gate line G may be reduced. If desired, each of the gate line portions GV of display 14 may be divided into active and dummy portions in this way. Dummy lines GVD may also be located on the edges of display 14 (e.g., in triangular dummy line regions of the type shown in FIGS. 13 and 14 or in regions of other shapes).

Figure 15:
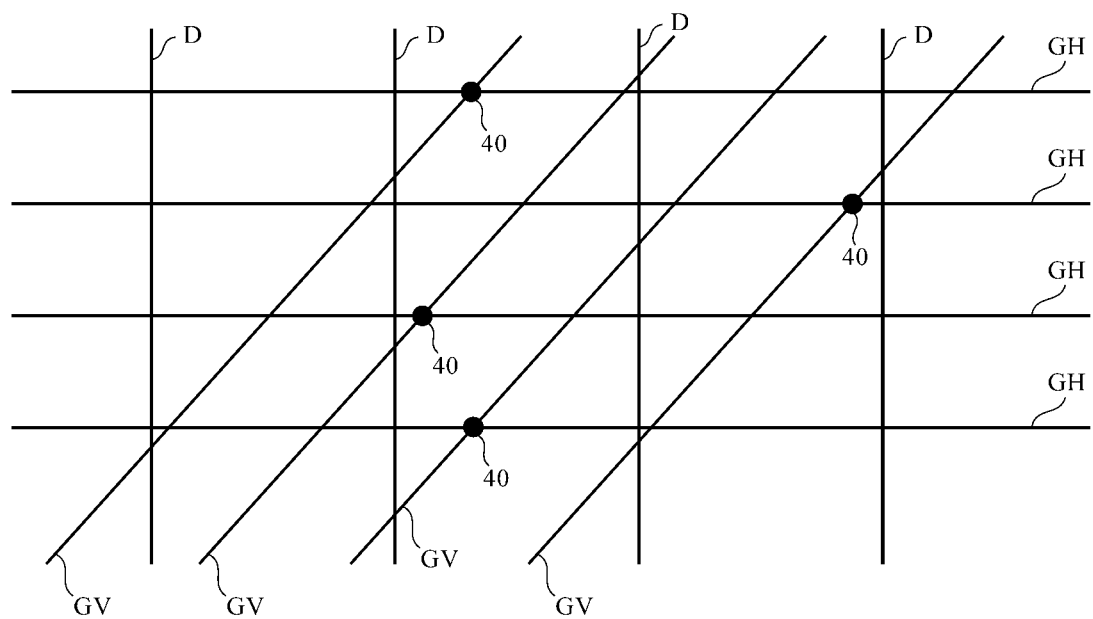
FIG. 15 is a diagram of an illustrative gate line pattern in which non-horizontal portions of each gate line have diagonal orientations and are connected by vias to respective horizontal portions in accordance with an embodiment.

In addition to or instead of using zigzag shapes for the non-horizontal portions of each gate line, gate lines may have non-horizontal portions that run diagonally for some or all of their length. These diagonal segments may each cross multiple data lines. FIG. 15 is a diagram of an illustrative gate line pattern in which the non-horizontal portions GV of each gate line have diagonal orientations and are connected by vias 40 to respective straight horizontal gate line portions GH.

The foregoing is merely illustrative and various modifications can be made by those skilled in the art without departing from the scope and spirit of the described embodiments. The foregoing embodiments may be implemented individually or in any combination.

What is claimed is:

1. A display, comprising:
   an array of pixels organized in rows and columns;
   vertically extending data lines each of which is associated with a respective one of the columns of pixels; and
   a plurality of gate lines each of which has a straight horizontal portion associated with a respective one of the rows of pixels and each of which has a vertical portion that crosses more than one of the data lines, wherein each of the vertical portions includes at least one zigzag portion and wherein at least some of the zigzag portions comprise active segments of gate lines that have respective dummy gate line segments that are separated by gaps from the active segments.

2. The display defined in claim 1 further comprising:
   a substrate having one or more edges; and
   display driver circuitry along a given one of the edges, wherein the display driver circuitry supplies image data signals to the data lines and gate line signals to the zigzag portions.

3. The display defined in claim 2 further comprising vias, wherein the straight horizontal portion of each gate line is connected to the at least one zigzag portion of that gate line by a respective one of the vias.

4. The display defined in claim 1 wherein the dummy gate line segments are maintained at a fixed voltage.

5. The display defined in claim 4 wherein the dummy gate line segments are not connected to any straight horizontal gate line segments.

6. The display defined in claim 1 further comprising:
   display driver circuitry; and
   auxiliary gate line portions, wherein the display driver circuitry drives signals onto at least one auxiliary gate line portion with a first swing direction while driving a gate line signal onto a given one of the gate lines that is adjacent to the auxiliary gate line portion with a second swing direction that is opposite to the first swing direction.

7. The display defined in claim 6 wherein the auxiliary gate line portion is not connected to any straight horizontal gate line.

8. The display defined in claim 1 wherein the zigzag portions have a staircase pattern.

9. The display defined in claim 1 wherein the zigzag portions have a waterfall pattern.

10. The display defined in claim 2 wherein at least some of each of the zigzag portions has vertically extending segments that traverse a number of the rows of pixels that changes as a function of increasing distance from the display driver circuitry.

11. The display defined in claim 1 wherein the dummy gate line segments include at least some portions that run parallel to portions of the gate lines and wherein the dummy gate line segments are not connected to any straight horizontal gate line portions.

12. The display defined in claim 1 wherein each zigzag portion is overlapped by portions of the vertically extending data lines.

13. The display defined in claim 1 wherein at least some of the data lines are each overlapped by the zigzag portions of more than one of the gate lines.

14. The display defined in claim 13 wherein the array of pixels is formed on a non-rectangular substrate.

15. The display defined in claim 13 further comprising:
    a substrate having at least one edge, wherein the array of pixels is formed on the substrate; and
    display driver circuitry along a given edge of the substrate, wherein the display driver circuitry supplies image data signals to the data lines and gate line signals to the zigzag portions of the gate lines.

16. The display defined in claim 15 wherein the substrate has four edges.

17. The display defined in claim 15 wherein the substrate is oval.

* * * * *